(12) United States Patent
Hsieh et al.

(10) Patent No.: US 6,483,186 B1
(45) Date of Patent: Nov. 19, 2002

(54) HIGH POWER MONOLITHIC MICROWAVE INTEGRATED CIRCUIT PACKAGE

(75) Inventors: Tsung-Ying Hsieh, Hsinchu (TW); Chin-Lien Hsu, Hsinchu (TW); Wen-Rui Hsu, Taoyuan (TW)

(73) Assignee: Apack Communications Inc., Hsinchu (TW)

( * ) Notice: Subject to any disclaimer, the term of this patent is extended or adjusted under 35 U.S.C. 154(b) by 0 days.

(21) Appl. No.: 09/998,444

(22) Filed: Nov. 27, 2001

(30) Foreign Application Priority Data

Sep. 11, 2001 (TW) .................................... 90122432 A

(51) Int. Cl.[7] .................... H01L 23/10; H01L 23/34; H01L 23/15
(52) U.S. Cl. .................... 257/707; 257/717; 257/728; 257/712; 257/705
(58) Field of Search .................... 257/688, 690, 257/692, 697, 700, 701, 702, 705, 706, 707, 709, 712, 717, 728, 737, 753, 778

(56) References Cited

U.S. PATENT DOCUMENTS 5,904,499 A * 5/1999 Pace ........................ 438/108
6,002,147 A * 12/1999 Iovdalsky et al. .......... 257/275

* cited by examiner

Primary Examiner—Nathan J. Flynn
Assistant Examiner—Victor Mandala, Jr.
(74) Attorney, Agent, or Firm—J.C. Patents

(57) ABSTRACT

A monolithic microwave integrated circuit (MMIC) package comprises a MMIC die, a heat sink, an insulation substrate, and a sealing material. The MMIC die has an active region and a peripheral region. The heat sink is located in the active region. A plurality of bonding pads are located in the peripheral region. The insulation substrate has an opening and a plurality of transit ports. The opening is used to contain the heat sink and the transit ports are electrically connected to the bonding pads. The sealing material is filled between the insulation substrate and the MMIC die to cover the whole MMIC die so that the MMIC die is fixed to the insulation substrate and is protected.

14 Claims, 4 Drawing Sheets

HIGH POWER MONOLITHIC MICROWAVE INTEGRATED CIRCUIT PACKAGE

CROSS-REFERENCE TO RELATED APPLICATION

This application claims the priority benefit of Taiwan application serial no. 90122432, filed Sep. 11, 2001.

BACKGROUND OF THE INVENTION

1. Field of the Invention

The present invention relates to a monolithic microwave integrated circuit (MMIC) package. More specifically, the present invention relates to a flip chip type MMIC package.

2. Description of the Related Art

Currently, the operational frequency of a common micro/millimeter wave integrated circuit is from about 3–30 GHz to 30–300 GHz. The functions and applications of the microwave/millimeter wave integrated circuit are limited to the package thereof. Therefore, to succeed in the MMIC market, a MMIC package having a high operational frequency, low parasitic capacitance and parasitic conductance, superior heat dissipation performance, compact body, low production cost, and an ability to mass production is required.

FIG. 1 is a schematic cross-sectional view of a conventional MMIC package. The package shown in FIG. 1 is a small outline integrated circuit (SOIC) package that is most widely used. The chip 104 is attached to a die region 106 of a leadframe 102 by surface mounting. A bonding wire 108 is used to electrically connect the chip 104 to the leadframe 102. A sealing material 110 covers and fixes the wire 108, the chip 104 and, a portion of the leadframe 106. A package is formed after molding with a capsulatant 112, which protects the electric properties from being deteriorated by moisture, dusts, or the like in the atmosphere. However, the leadframe may generate serious parasitic capacitance and parasitic conductance effects.

An approach to solve the above problem has been proposed. As shown in FIG. 2, a schematic cross-sectional view of another conventional MMIC package with an insulation substrate used as a carrier for a MMIC die 204 of a MMIC package 200. The insulation substrate has an upper surface and a lower surface. The upper surface and the lower surface are provided with a plurality of contacts 202a and 202b, respectively. The contact 202a and the contact 202b are electrically connected through a via hole 202c. After the MMIC die 204 is attached to the insulation substrate 202, a bonding wire 206 is used to electrically connect the contact 203 on the MMIC die 204 to the contact 202a on the insulation substrate. Finally, the sealing material 208 covers and fixes the MMIC die 204 and the bonding wire 206. A package is formed after molding with a capsulatant 210.

In the prior, the bonding wire may result in parasitic capacitance and parasitic conductance effects, which causes impedance and self-oscillation.

SUMMARY OF THE INVENTION

It is one object of the present invention to provide a MMIC package, which reduces the parasitic capacitance and the parasitic conductance.

It is another object of the present invention to provide a MMIC package, which has a heat sink bonded to an active region of the MMIC die to effectively dissipate heat.

It is still another object of the present invention to provide a MMIC package in which the electric connection between the chip and the insulation substrate is achieved by the flip chip technology instead of the wire bonding technology, resulting in a reduced package size.

It is still another object of the present invention to provide a MMIC package, which is applicable to the surface mount technology and is able to put into mass production.

In order to accomplish the above and other objects of the present invention, a monolithic microwave integrated circuit (MMIC) package comprising a MMIC die, a heat sink, an insulation substrate, and a sealing material is provided. The MMIC die has an active region and a peripheral region. The heat sink is located in the active region of the MMIC die. A plurality of bonding pads are located in the peripheral region. The insulation substrate has an opening and a plurality of transit ports. The opening is used to contain the heat sink, and the transit ports are electrically connected to the bonding pads. The sealing material is filled between the insulation substrate and the MMIC die to cover the whole MMIC die so that the MMIC die is fixed to the insulation substrate and is protected.

The transit ports of the insulation substrate are electrically connected to the bonding pads on the MMIC die by bumps. These bumps can be formed on the bonding pads of the MMIC die or on the transit port of the insulation substrate.

The heat sink that is used for the present invention is slightly smaller than the opening.

In one aspect of the present invention, the transit port of the insulation substrate further comprises a first contact, a second contact, and a via hole. The first contact is located on the upper surface of the insulation substrate. The second contact is located on he lower surface of the insulation substrate. The via hole is located in the insulation substrate and is used to electrically connect the first contact to the second contact.

In another aspect of the present invention, the transit port of the insulation substrate comprises a first contact and a second contact, which are not electrically connected to each other through a via hole. The first and second contacts disconnected to each other are used as dummy contacts.

The first contact on the upper surface of the insulation substrate is electrically connected to the bonding pad of the MMIC die.

The heat sink is bonded to the active region of the MMIC die by an adhesive layer. The adhesive layer can be made of a low dielectric material or a thermally conductive compound.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
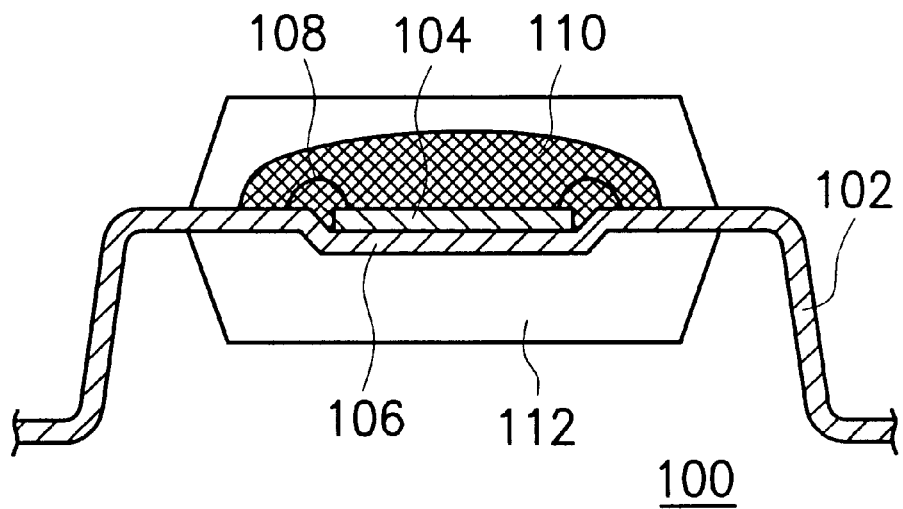
FIG. 1 is a schematic cross-sectional view of a conventional MMIC package.
Figure 2:
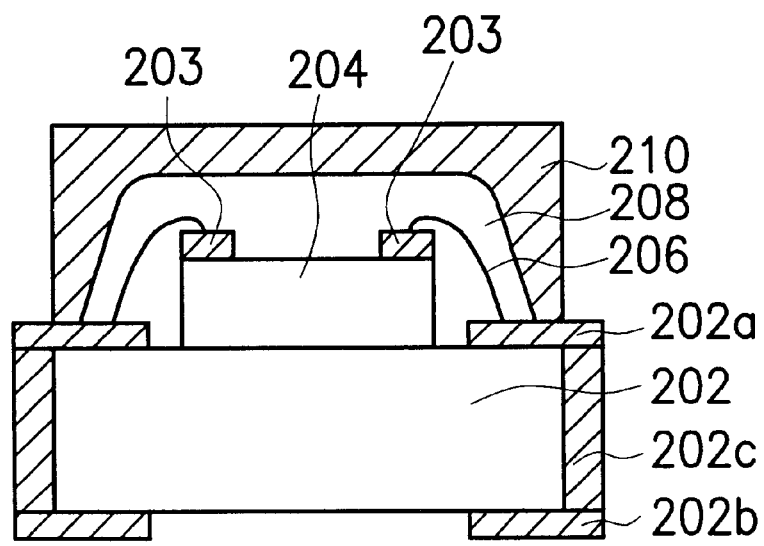
FIG. 2 is a schematic cross-sectional view of another conventional MMIC package.

Reference will now be made in detail to the present preferred embodiments of the invention, examples of which are illustrated in the accompanying drawings. Whenever possible, the same reference numbers are used in the drawings and the description to refer to the same or like parts.

A MMIC is mainly divided into a low power package with power lower than 1 mW and a high power package with power higher than 1 Mw. The high power MMIC package generates more heat than the low power package. The present invention is particularly suitable for the high power MMIC package.

Figure 3:
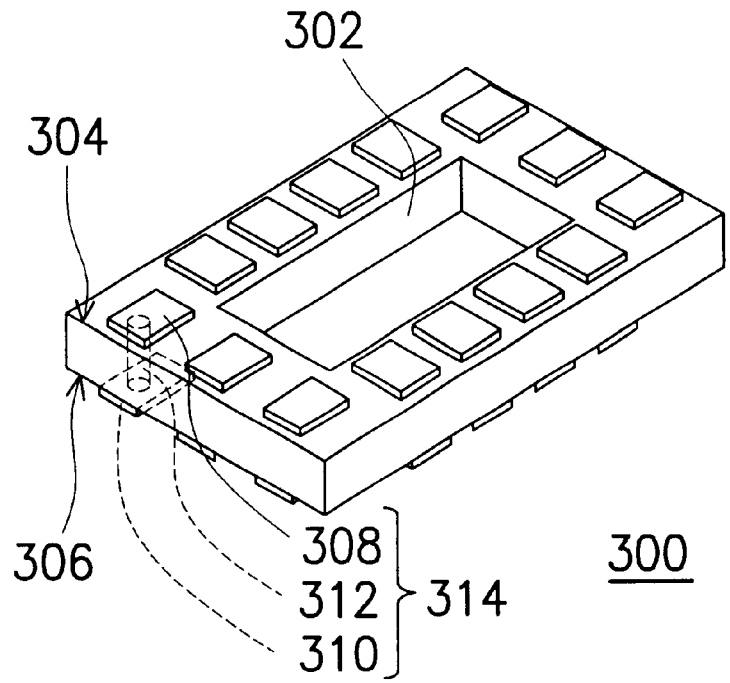
FIG. 3 is a perspective view of an insulation substrate of a MMIC package to a preferred embodiment of the present invention.

FIG. 3 is a perspective view of an insulation substrate of a MMIC package according to a preferred embodiment of the present invention. The insulation substrate 300 is located in the central region and has an opening 302. The opening 302 can be formed in ellipse, rectangle, circle or any suitable shape. The insulation substrate 300 has an upper surface 304 and a lower surface 306 opposite to the upper surface 304. A plurality of first contacts 308 are provided on a peripheral region of the upper surface 304. A plurality of second contacts 310 are provided on a peripheral region of the lower surface 306. A plurality of via holes 312 are formed in the insulation substrate 300 to electrically connect the first contacts 308 and the second contacts 310, respectively. The above first contact 308, the second contact 310, and the via hole 312 form a transit port 314.

Figure 4:
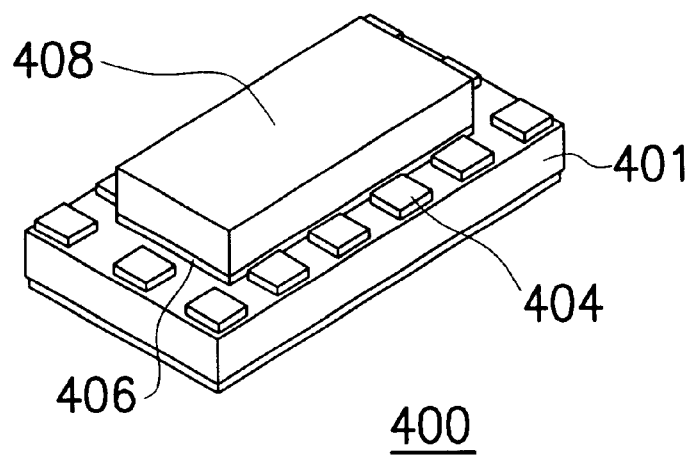
FIG. 4 is a perspective view showing a MMIC bonded to a heat sink according to a preferred embodiment of the present invention.

FIG. 4 is a perspective view of a MMIC package 400 after a MMIC die is bonded with a heat sink according to a preferred embodiment of the present invention. The MMIC die 401 has an active surface (not shown) on which a plurality of bonding pads 404 are provided in the peripheral region and a heat sink 408 is further provided in the central region. The heat sink 408 is bonded to the active surface by a non-conductive adhesive layer 406. The heat sink 408 is formed of a thermally conductive compound such as BeO. The adhesive layer 406 has to be a low-dielectric-constant material that is also thermally conductive such as non-electrical-conductive epoxy.

With reference to FIGS. 3 and 4, the first contacts 308 on the insulation substrate 300 corresponds to the bonding pads 404 on the MMIC die 401 such that the bonding pads 404 on the MMIC die 401 are electrically connected to the first contacts 308 on the insulation substrate by means of metal bumps after chip flipping. Furthermore, the heat sink 408 bonded to the active region is slightly smaller than the opening in the insulation substrate. Therefore, the heat sink 408 bonded to the active region is located in the opening 302 in the insulation substrate 300 after chip flipping, thereby improving heat dissipation ability of the MMIC package.

Figure 5:
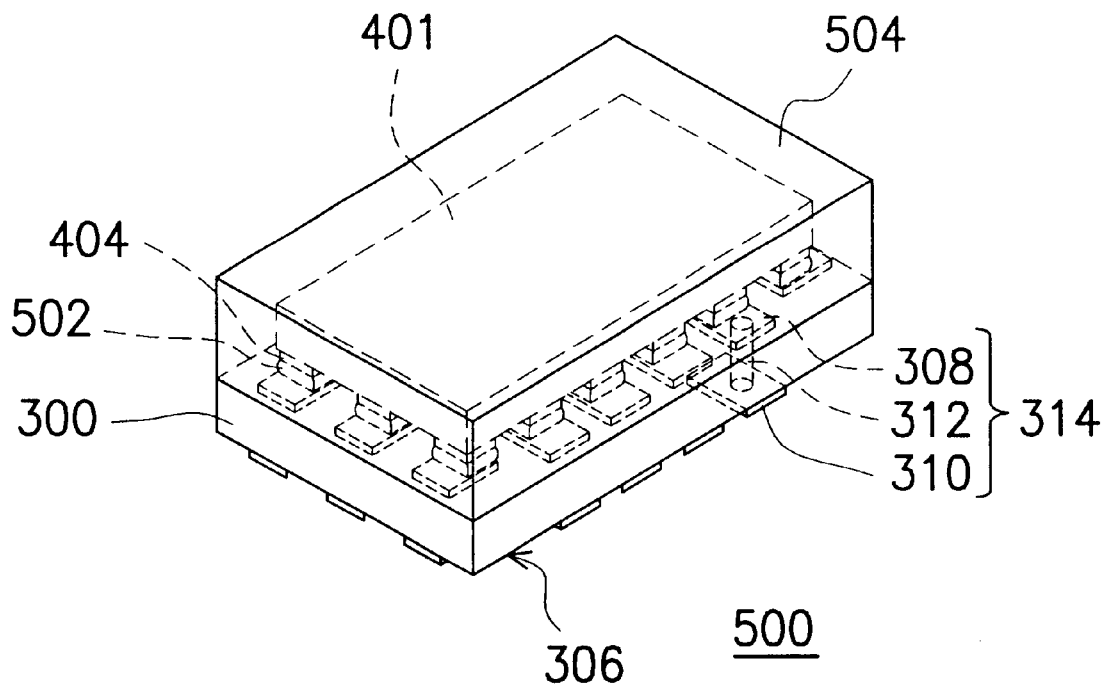
FIG. 5 is a perspective view of a MMIC package according to a preferred embodiment of the present invention.

FIG. 5 is a perspective view of a MMIC package according to a preferred embodiment of the present invention. The MMIC die 401 is subject to a flip chip process and put on the insulation substrate 300 to form a MMIC package 500. The electric connection between the first contacts 308 of the insulation substrate 300 and the bonding pads 404 on the MMIC die 401 is achieved by bumps 502, for example. After the first contacts 308 are electrically connected to the bonding pads 404, a sealing material is poured into the gaps between the MMIC die 401 and the insulation substrate 300 to cover the whole MMIC die 401. As a result, a package mold 504 is achieved. The package mold 504 serves to fix and protect the MMIC die 401.

In this embodiment, the transit ports 314 on the insulation substrate 300 correspond to the bonding pads 404 on the MMIC die 401 so that the I/O signals of the MMIC die 401 are transmitted to the second contacts on the lower surface 306 of the insulation substrate 300 through the via hole 312. Therefore, parasitic conductance effects caused by signal transmission in the insulation substrate 300 are avoided.

The insulation substrate 300 is exemplified for illustration of the present invention. However, the present invention is not limited to the above-specified example. The location and number of the transit ports 314 on the insulation substrate 300 may vary as desired.

Furthermore, the via holes 312 between the first contacts 308 on the upper surface 304 of the insulation substrate 300 and the second contacts 310 on the lower surface 306 can be optionally provided. More specifically, there is no via hole 312 between part of the first contacts 308 and part of the second contacts 310 for electric connection. The first contacts 308 and the second contacts 310 are not electrically connected to each other through any via hole that are used as dummy contacts. The dummy pads on the MMIC die 401 may help to distribute the stress due to chip flipping.

Figure 6:
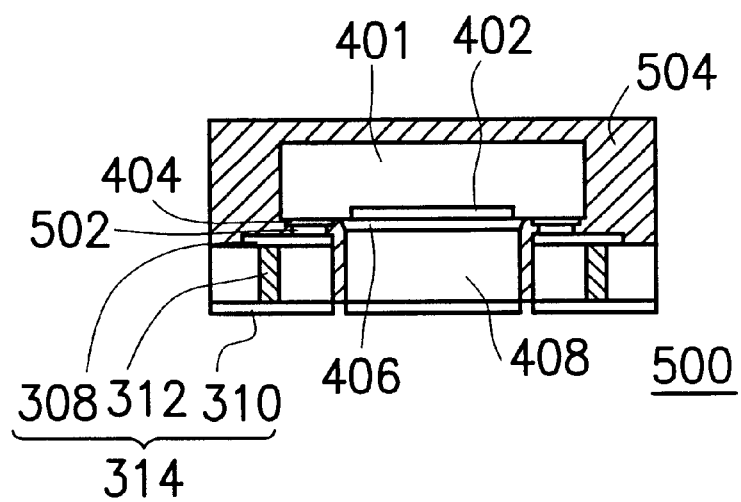
FIG. 6 is a schematic cross-sectional view of a MMIC package according to a preferred embodiment of the present invention.

FIG. 6 is a cross-sectional view of a MMIC according to a preferred embodiment of the present invention. In the MMIC package 500, the bonding pads 404 used for transmitting high frequency signals are connected to the transit ports 314 of the insulation substrate 300 by the bumps 502. For example, the radio frequency signal is transmitted from ground-signal-ground (G-S-G) or signal-ground, (S-G) I/O ports on the MMIC die to the S-G-S or S-G I/O ports on the insulation substrate. The second contacts 310 exposed to the lower surface 306 of the insulation substrate 300 are used as I/O port of the MMIC package 500. With such a structure, the electric properties of the MMIC package would not be deteriorated. Furthermore, the above package is applicable to the surface mount technology (SMT).

FIG. 6 shows a gap between the opening 302 and the heat sink 408 that can be filled with a sealing material in a subsequent molding process. The sealing material not only fixes the die to the insulation substrate, but also protects the package from external aggressions, especially moisture.

Figure 7:
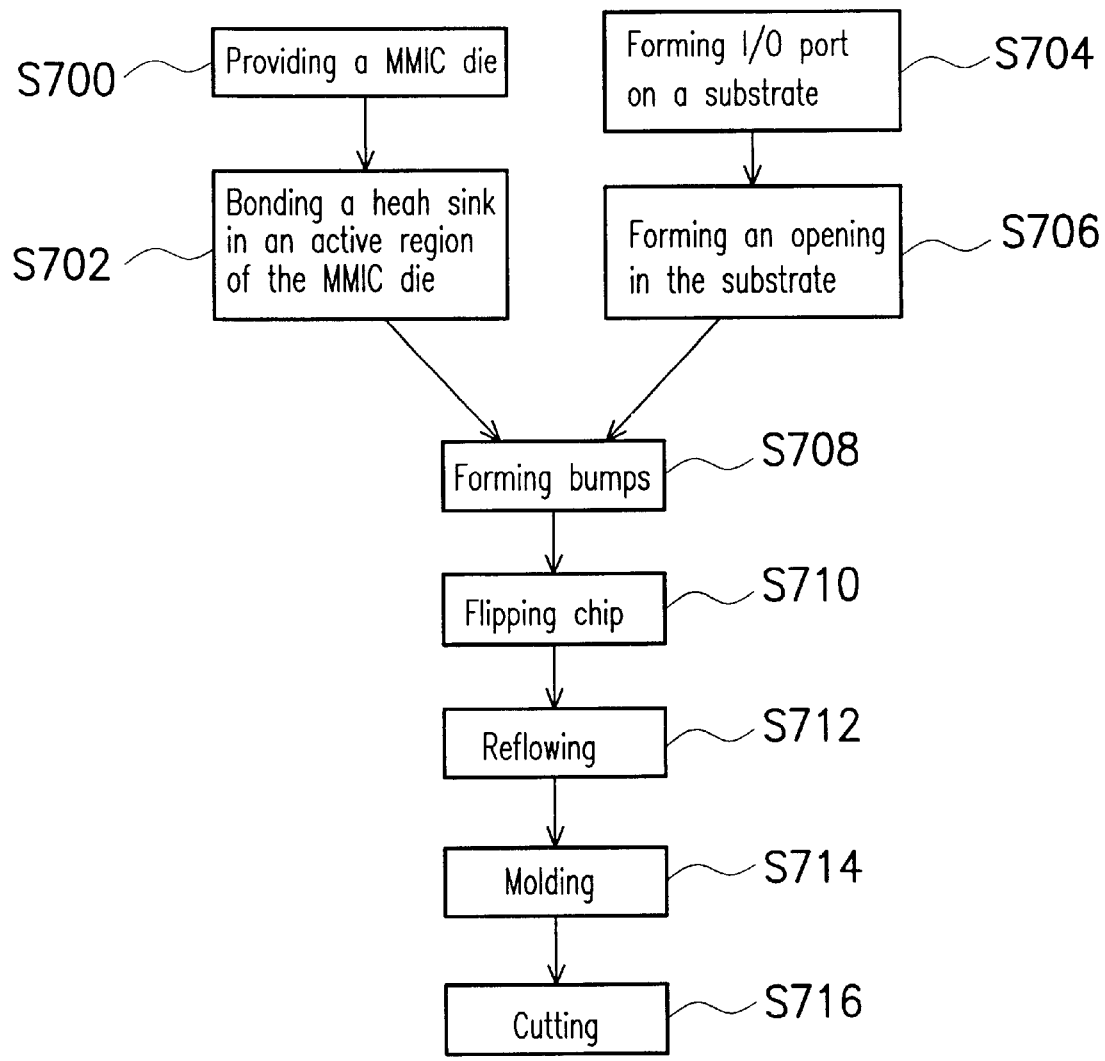
FIG. 7 is flow chart of producing a MMIC package according to a preferred embodiment of the present invention.

FIG. 7 is a flow chart of producing a MMIC package according to a preferred embodiment of present invention. First, a heat sink is bonded to an active region of the MMIC die (S702) of a MMIC (S700) having an active surface is provided. The heat sink effectively helps to dissipate the heat generated from the die. The I/O ports are formed on the insulation substrate (S704). Then, an opening is formed in the insulation substrate (706).

Bumps are formed after the insulation substrate and the MMIC die have been prepared (S708). The bumps can be formed on the bonding pads of the MMIC die or on the first contacts of the insulation substrate. In consideration of production cost and yield, the bumps are preferably formed on the first contacts to prevent damage of the MMIC die if the bumps fail. If the bumps on the insulation substrate fail, the deficient can be reworked.

After the bumps are formed, a flip chip process is carried out (S710). The MMIC die is flipped and aligned with the insulation substrate in a desired manner. Then, a reflow process is performed (S712) to complete the electric connection between the MMIC die and the transit ports of the insulation substrate.

Finally, a molding process is carried out (S714). A sealing material is poured into the gaps between the MMIC chop and the insulation substrate to cover the whole MMIC die and then is cured to form a package mold 504. The package mold 504 serves to fix and protect the MMIC die. During molding (S714), the sealing material fills the bumps and the gap between the heat sink and the opening. After the molding process is completed, a cutting process is performed to accomplish a MMIC package (S716).

In a light of foregoing, the MMIC package of the present invention has the following advantages over the prior art. The MMIC package obtained by the present invention using chip flipping has reduced parasitic capacitance and parasitic conductance. The heat sink bonded to the active region of the MMIC die effectively helps dissipate heat. Moreover, the electric connection between the die and the insulation substrate is achieved by the flip chip technology instead of the wire bonding technology, resulting in a reduced package size. Furthermore, the MMIC package obtained by the present invention is suitable for surface mount technology and is able to put into mass production.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A monolithic microwave integrated circuit (MMIC) package, comprising:
    a MMIC die having an active region and a peripheral region, wherein a plurality of bonding pads are located in the peripheral region;
    a heat sink located on the active region;
    an insulation substrate having an opening and a plurality of transit ports, wherein the opening is used to contain the heat sink and the transit ports are electrically connected to the bonding pads; and
    a sealing material filled between the insulation substrate and the MMIC die to cover the whole MMIC die, such that the MMIC die is fixed to the insulation substrate and is protected.

2. The MMIC package of claim 1, wherein each of the transit ports is electrically connected to each of the bonding pads by a bump.

3. The MMIC package of claim 1, wherein the heat sink is smaller than the opening.

4. The MMIC package of claim 1, wherein each transit port further comprising:
    a first contact located on an upper surface of the insulation substrate;
    a second contact located on a lower surface of the insulation substrate; and
    a via hole located in the insulation substrate and used to electrically connect the first contact to the second contact.

5. The MMIC package of claim 4, wherein the first contact is electrically connected to the bonding pad.

6. The MMIC package of claim 1, wherein the heat sink is bonded to the active region by an adhesive layer.

7. The MMIC package of claim 6, wherein the adhesive layer is made of a dielectric material.

8. The MMIC package of claim 1, wherein the heat sink is made of a thermally conductive compound.

9. A MMIC package, comprising:
    a MMIC die having an active region and a peripheral region, wherein a plurality of bonding pads are located in the peripheral region;
    a heat sink located on the active region;
    an insulation substrate having an opening and a plurality of transit ports, wherein each transit port further comprising a first contact located on an upper surface of the insulation substrate, a second contact located on a lower surface of the insulation substrate, and a via hole located in the insulation substrate, the electric connection between the first contact to the second contact being achieved by the via hole, the MMIC die being mounted on the insulation substrate in such a manner that the heat sink is positioned in the opening of the insulation substrate and the bonding pads are electrically connected to the transit ports; and
    a sealing material filled between the insulation substrate and the MMIC die to cover the whole MMIC die such that the MMIC die is fixed to the insulation substrate and is protected.

10. The MMIC package of claim 9, wherein each of the transit ports is electrically connected to each of the bonding pads by a bump.

11. The MMIC package of claim 9, wherein the heat sink is smaller than the opening.

12. The MMIC package of claim 9, wherein the heat sink is bonded to the active region by an adhesive layer.

13. The MMIC package of claim 12, wherein the adhesive layer is made of a dielectric material.

14. The MMIC package of claim 9, wherein the heat sink is made of a thermally conductive compound.

\* \* \* \* \*